(12) United States Patent
Kurita

(10) Patent No.: US 6,753,238 B2
(45) Date of Patent: Jun. 22, 2004

(54) SEMICONDUCTOR DEVICE AND MANUFACTURING METHOD THEREOF

(75) Inventor: Yoichiro Kurita, Kanagawa (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/374,452

(22) Filed: Feb. 26, 2003

(65) Prior Publication Data

US 2003/0164547 A1 Sep. 4, 2003

(30) Foreign Application Priority Data

Mar. 1, 2002 (JP) ........................................ 2002-056044

(51) Int. Cl.⁷ .......................... H01L 21/30; H01L 21/46
(52) U.S. Cl. ...................... 438/459; 438/977; 257/619
(58) Field of Search .................................. 438/110, 113, 438/459, 460, 689, 977; 257/433, 619, 787, 788

(56) References Cited

U.S. PATENT DOCUMENTS 6,350,664 B1 * 2/2002 Haji et al. .................. 438/459
6,506,681 B2 * 1/2003 Grigg et al. ................ 438/692
6,562,658 B2 * 5/2003 Ohuchi et al. .............. 438/113

FOREIGN PATENT DOCUMENTS

| JP | 08-316194 | 11/1996 | ......... H01L/21/306 |
| JP | 2001-223202 | 8/2001 | ......... H01L/21/306 |

* cited by examiner

Primary Examiner—Wael Fahmy
Assistant Examiner—Hoai Pham
(74) Attorney, Agent, or Firm—Hayes Soloway P.C.

(57) ABSTRACT

A bump is formed at a predetermined position on a surface of a semiconductor wafer and a sealing resin is formed so as to cover the surface and to make a surface of the bump exposed. Then, a reinforcing plate is bonded to the sealing resin and the exposed surface of the bump through an adhesive, and a rear portion of the semiconductor wafer is ground using a grind stone or removed by wet etching. Then, the rear surface of the thinned semiconductor wafer is covered with another sealing resin.

12 Claims, 10 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and particularly relates to a thinned semiconductor wafer or thinned semiconductor chip and a forming method thereof.

2. Description of the Related Art

In recent years, an IC or LSI has been increasingly accelerated to have higher integration and larger capacity. To address this trend, a semiconductor chip is fabricated in a CSP (chip size package) in order to incorporate the CSP within a portable device and as the portable device becomes small and is made to have high performance, the CSP is required to occupy smaller area and have a smaller height for dense integration of CSPs. Furthermore, an MCP (multi-chip package) incorporating a plurality of semiconductor chips therein has been put into practical use.

Furthermore, as an information technology has been rapidly spread and is now in use for variety technical fields, semiconductor devices constituting an information processing device increasingly need to be fabricated as a system LSI. Additionally, a variety of functional blocks including a plurality of semiconductor chips such as compound semiconductor chips formed of an optical device/high frequency device need to be integrated as a system LSI, increasingly requiring a packaging technique for electronic system integration.

In order to achieve high-density packaging of semiconductor chips, a semiconductor chip needs to be thinned, in more detail, thinned to a thickness of 50 μm or less.

A semiconductor chip typically can be thinned by grinding or etching a backside of a semiconductor wafer. Such a technique is described in, for example, JP 08-316194 A or JP 2001-223202 A. A conventional technique will be explained below with reference to FIGS. 1A to 1C.

As shown in FIG. 1A, a protection tape 102 is bonded to a surface of a semiconductor wafer 101. Then, the protection tape 102 bonded to the semiconductor wafer 101 is fixed in a vacuum state to a grinding suction stage 103 and the grinding suction stage 103 is made to rotate, with a rear surface of the semiconductor wafer 101 being in contact with a rotating grind stone 104, in order to grind the rear surface thereof. Then, the semiconductor wafer 101 is thinned to a predetermined thickness of, for example, approximately 100 μm.

Thereafter, the semiconductor wafer is removed from a grinding device. As a result, as shown in FIG. 1B, the protection tape 102 bonded to the surface of the thinned semiconductor wafer 101a is obtained. In this case, the protection tape 102 causes the thinned semiconductor wafer 101a to slightly be bended.

The protection film 102 is peeled from the thinned semiconductor wafer 101a and the semiconductor wafer 101a is diced into semiconductor chips 105. That is, as shown in FIG. 1C, an expansion sheet 106 is bonded to the rear surface of the semiconductor wafer 101a and the wafer 101a is mounted onto a dicing device, and then, the semiconductor wafer 101a is diced from the front surface thereof. Thereafter, the expansion sheet 106 is elongated to produce the individual semiconductor chips 105.

As described above, in the high-density packaging of semiconductor devices, particularly in the CSP, a semiconductor chip has to be thinned. For example, the semiconductor chip needs to be of a thickness of 50 μm or less.

However, the thinned semiconductor wafer formed using the prior art explained in the description of FIGS. 10A to 10C is increasingly bended when being thinned, leading to a significant reduction in the yield of a semiconductor device. This is because the thinned semiconductor wafer cannot be mounted in place on the stage and the extremely bended chip is easily destroyed in the step of dicing a wafer.

Furthermore, when making a semiconductor wafer have a film thickness of approximately 20 μm, a wet etching has to additionally be performed after grinding the rear surface of the wafer. In this case, when the wafer is bended, the wafer is etched to have large variations in its thickness. Therefore, a large number of semiconductor chips having a thickness beyond an allowable range of thickness are produced, lowering the yield of a semiconductor device.

The problem found in the above-described conventional technique for thinning a semiconductor wafer becomes enlarged as a diameter of the semiconductor wafer increases (for example, a semiconductor wafer of a diameter of 12 inches).

SUMMARY OF THE INVENTION

The present invention has been made in view of the above, and therefore has a main object to provide a semiconductor device that facilitates reduction in film thickness of a semiconductor chip and a manufacturing method thereof. Further, another object of the present invention is to simplify a technique of high-density mounting of semiconductor devices and facilitate application of the technique to mass production.

Therefore, according to a first aspect of the present invention, a method of manufacturing a semiconductor device includes the steps of: forming at least one electrode at a specific position on a semiconductor wafer, the specific position being located on a surface of the semiconductor wafer; bonding a reinforcing plate to a surface of the at least one electrode while interposing a first resin layer between the surface of the semiconductor wafer and the reinforcing plate via an adhesive; thinning the semiconductor wafer by removing a portion of the semiconductor wafer; and covering an exposed surface of the semiconductor wafer with a second resin layer, the exposed surface being produced by removing the portion of the semiconductor wafer.

According to a second aspect of the present invention, a method of manufacturing a semiconductor device includes the steps of: forming at least one electrode at a specific position on a semiconductor wafer having an SOI (Silicon On Insulator) structure, the specific position being located on a surface of the semiconductor wafer, the SOI structure being defined such that an insulation layer is formed over a silicon substrate and an active silicon layer is formed over the insulation layer; forming a first resin layer between the at least one electrode on the surface of the semiconductor wafer; thinning the semiconductor wafer by removing the silicon substrate of the semiconductor wafer to expose the insulation layer; and covering an exposed surface of the insulation layer with a second resin layer.

According to a third aspect of the present invention, a semiconductor device includes: at least one electrode formed at a specific position on a semiconductor wafer, the specific position being located on a surface of the semiconductor wafer; a first resin layer interposed between the at least one electrode formed at a specific position on a semiconductor wafer and formed on the surface of the semiconductor wafer; and a second resin layer formed on an opposite surface of the semiconductor wafer, the opposite surface being produced by removing a portion of the semiconductor wafer, the portion being located opposite the surface of the semiconductor wafer.

According to the present invention, the semiconductor wafer rarely bends after the wafer is thinned and variation in thickness of the thinned semiconductor wafer is significantly reduced. Therefore, the wafer can be handled without breaking or damaging the wafer in the step of thinning a semiconductor wafer, thereby improving the yield of semiconductor wafer.

Moreover, according to the present invention, dense packaging of semiconductor chips is extremely facilitated. Then, when implementing the CSP technique according to the present invention, the semiconductor chip can extremely be thinned in a simplified manner. Therefore, cracks that are caused in a solder ball connection portion and due to a difference between thermal expansion coefficients of the connection portion and a motherboard to which the CSP is mounted can significantly be reduced, which cracks are developed when implementing the conventional technique, whereby reliability of packaging of semiconductor devices can largely be improved.

Furthermore, the steps of manufacturing the semiconductor device are simplified and the dense packaging of semiconductor devices can easily be applied to mass production.

DETAILED DESCRIPTION OF THE PREFERRED EMBODIMENTS

Hereinafter, a first embodiment of the present invention will be described with reference to FIGS. 2A to 2D and FIGS. 3A, 3B. FIGS. 2A to 2D and FIGS. 3A, 3B are sectional views of a semiconductor wafer, illustrating steps of thinning the wafer in the order of the steps. Note that a semiconductor device according to the present invention will be explained in the description of the steps.

Figure 1A:
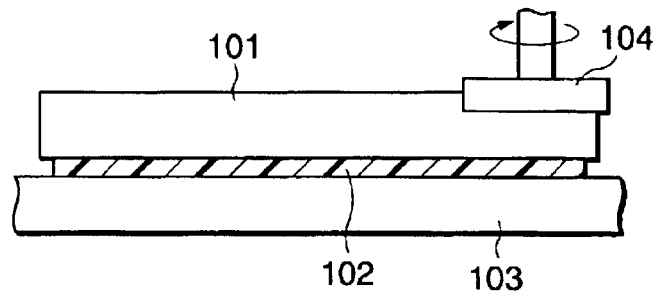
FIGS. 1A to 1C are substantially sectional views of manufacturing steps in sequential order for reduction in film thickness of a semiconductor wafer, the views explaining a prior art.
Figure 1B:
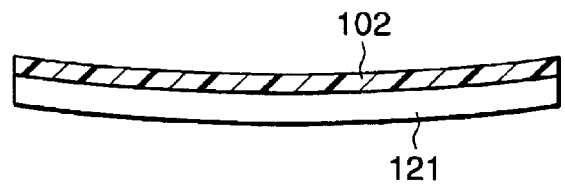
Figure 1C:
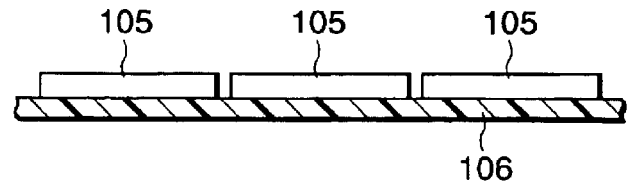
Figure 2A:
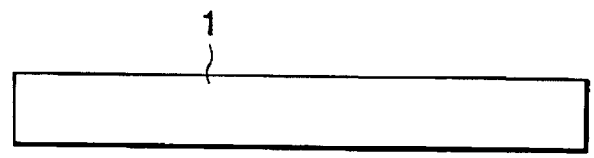
FIGS. 2A to 2D are sectional views of a semiconductor wafer, illustrating steps of thinning the wafer in the order of the steps.
Figure 2B:
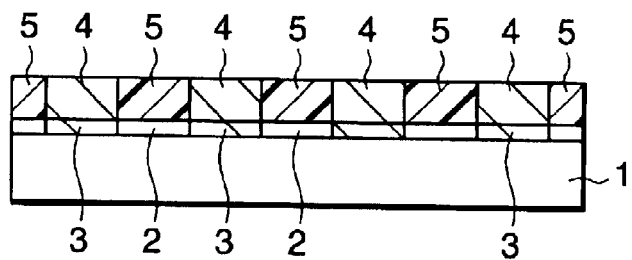

As shown in FIG. 2A, a semiconductor element and an interconnect line (not shown) are formed on a surface of a semiconductor wafer 1 having, for example, a diameter of 8 inches and a thickness of approximately 800 $\mu$m. As shown in FIG. 2B, a passivation film 2 is formed on the surface of the semiconductor wafer 1, and an interconnect line 3 for connection with external devices is exposed through the passivation film 2. Then, a bump 4 is formed on the interconnect line 3. The bump 4 is formed of gold or copper by plating, soldering, or the like to form an electrode. Then, as shown in FIG. 2B, a sealing resin 5 as a first resin layer is formed over the surface using a known method. In this case, the height of the bump 4 is approximately 20 $\mu$m and likewise, the thickness of the sealing resin 5 is approximately 20 $\mu$m. Note that the sealing resin 5 is a thermosetting resin.

Figure 2C:
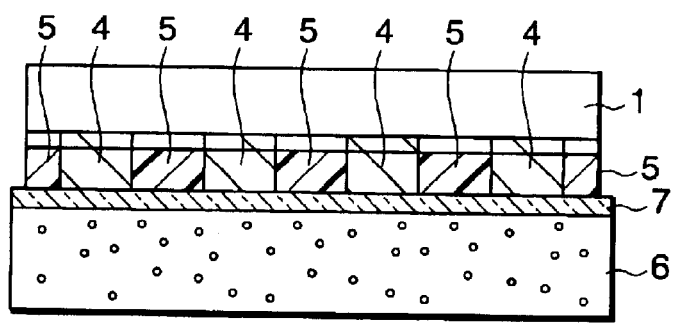

Subsequently, as shown in FIG. 2C, surfaces of the sealing resin 5 and the bump 4 are bonded to the surface of a reinforcing plate 6 via an adhesive agent 7 using a thermocompression bonding method. Note that the reinforcing plate 6 is a porous alumina plate (ceramic substrate) having a thickness of 10 mm.

Figure 2D:
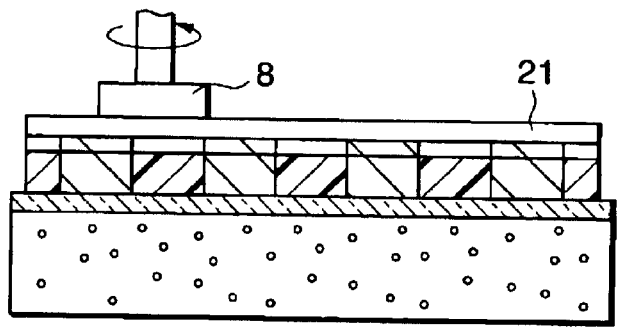

Then, as shown in FIG. 2D, a rear portion of the semiconductor wafer 1 is ground using a grind stone 8. Thereafter, wet etching is additionally performed using a mixed chemical containing nitric acid ($HNO_3$) and hydrofluoric acid (HF) to form an extremely thin semiconductor wafer 21 having a thickness of approximately 10 $\mu$m.

Figure 3A:
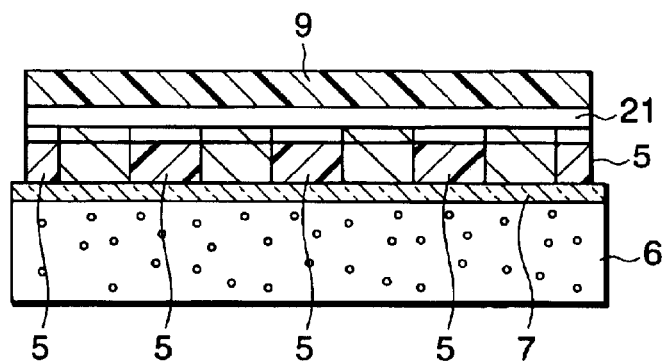
FIGS. 3A and 3B are sectional views of a semiconductor wafer, illustrating steps of thinning the wafer in the order of the steps.

Subsequently, as shown in FIG. 3A, a sealing resin 9 as a second resin layer is formed over the rear surface of the semiconductor wafer 21 using the known method. In this case, the sealing resin 9 is formed of the same material as that of the sealing resin 5 and may be formed to have the same thickness, i.e., 20 $\mu$m, as that of the sealing resin 5.

The reinforcing plate 6 is removed from the surfaces of the sealing resin 5 and the bump 4. The removal of the reinforcing plate 6 is performed as follows. That is, a structure in the state shown in FIG. 3A is immersed in a heated organic solution. In this case, the organic solution is a chemical for selectively dissolving the adhesive agent 7. When the structure is immersed in the organic solution, the chemical reaches the adhesive agent 7 through pores of the reinforcing plate 6 in order to dissolve 10 the adhesive agent 7. The reinforcing plate 6 is removed by dissolving the adhesive agent 7.

Figure 3B:
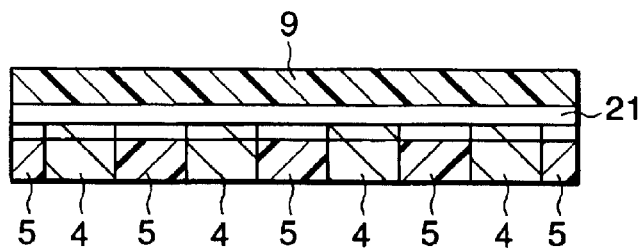

As a result, as shown in FIG. 3B, the structure is obtained in which: the bump 4 is formed on the surface of the semiconductor wafer 21 that is thinned to approximately 10 $\mu$m; the space between the bumps 4 is sealed with the sealing resin 5 having a thickness of approximately 20 $\mu$m; and the rear surface of the semiconductor wafer 21 is sealed with the sealing resin 9 having a thickness of approximately 20 $\mu$m. How the structure shown in FIG. 3B is divided into semiconductor chips will be described later.

According to the present invention, even if the semiconductor wafer 21 is extremely thin, the wafer never bends at all. The reason is that: first, the reinforcing plate 6 has a nearly complete rigidity and has little deformation; and the semiconductor wafer 1 is being supported by the reinforcing plate 6 beginning at the step prior to the grinding step; and further, in the step of thinning the semiconductor wafer 1, the front and rear surfaces of the wafer are sequentially sealed with resin; and still further, the sealing resins are formed of the same material and are formed to substantially have the same thickness.

A second embodiment of the present invention will be explained with reference to FIGS. 4A to 4D and FIGS. 5A, 5B. In the embodiment, a surface of a semiconductor wafer is previously cut in half to form grooves in the wafer. FIGS. 4A to 4D and FIGS. 5A, 5B are sectional views of a semiconductor wafer, illustrating steps of thinning the wafer in the order of the steps. Note that in the second embodiment, the same components as those of the first embodiment are denoted by the same reference numerals as those of the first embodiment.

Figure 4A:
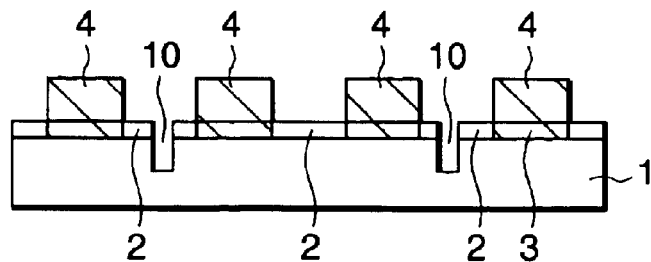
FIGS. 4A to 4D are sectional views of a semiconductor wafer, illustrating steps of thinning the wafer in the order of the steps.

As shown in FIG. 4A, a passivation film 2 and an interconnect line 3 are formed on the surface of the semiconductor wafer 1 on a side thereof, on which semiconductor elements and interconnect lines are formed. Then, a bump 4 is formed on the interconnect line 3. In this case, the height of the bump 4 is approximately 30 $\mu$m. Thereafter, the surface portion of the semiconductor wafer 1 is cut in half using the dicing device or the like to form a groove 10 in the wafer. Both the width and the depth of the groove 10 are 50 $\mu$m.

Figure 4B:
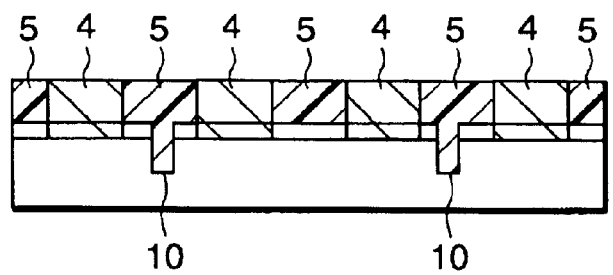

Subsequently, as shown in FIG. 4B, a sealing resin 5 is applied to the entire surface using the known method to seal the space between the bumps 4. In addition, the groove 10 is also filled with the sealing resin 5. Note that the thickness of the sealing resin 5 is approximately the same as the height of the bump, i.e., 30 $\mu$m.

Figure 4C:
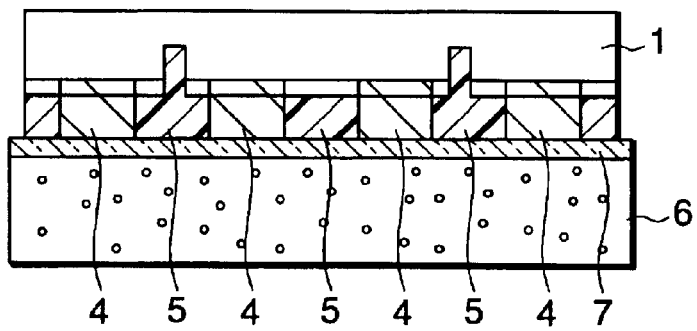

Then, as shown in FIG. 4C, surfaces of the sealing resin 5 and the bump 4 are bonded to the surface of a reinforcing plate 6 via an adhesive agent 7 using a thermocompression bonding method. Note that the reinforcing plate 6 is a porous alumina plate having a thickness of 10 mm.

Figure 4D:
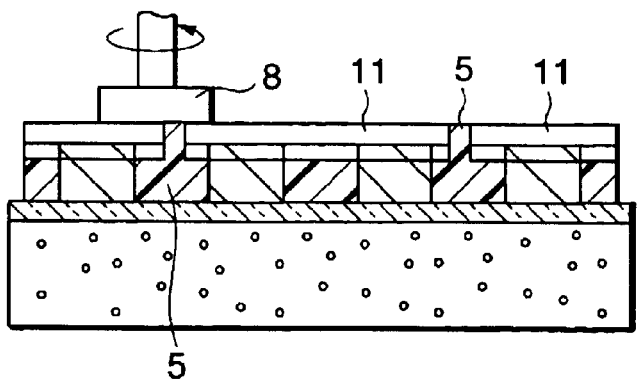

Then, as shown in FIG. 4D, a rear portion of the semiconductor wafer 1 is ground using a grind stone 8. Thereafter, wet etching is additionally performed using a mixed chemical containing nitric acid ($HNO_3$) and hydrofluoric acid (HF) to form an extremely thin semiconductor chip 11 having a thickness of approximately 10 $\mu$m. Through the grinding step, the sealing resin 5 comes to be exposed at the groove 10.

Figure 5A:
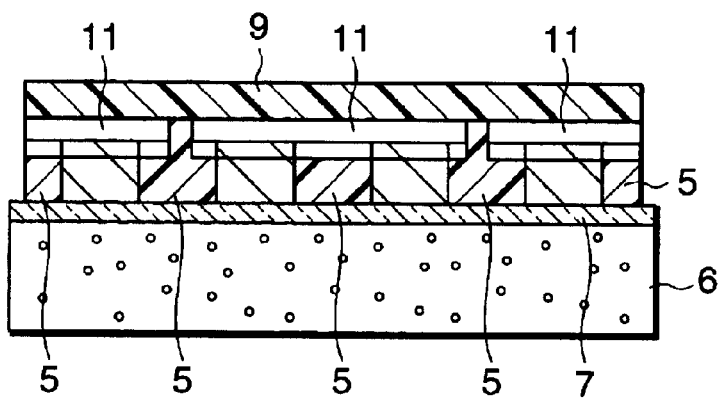
FIGS. 5A and 5B are sectional views of a semiconductor wafer, illustrating steps of thinning the wafer in the order of the steps.

Subsequently, as shown in FIG. 5A, a sealing resin 9 as a second resin layer is formed over the rear surface of the semiconductor chips 11 using the known method. In this case, the sealing resin 9 is formed of the same material as that of the sealing resin 5 and may be formed to have the same thickness, i.e., 20 $\mu$m, as that of the sealing resin 5.

The reinforcing plate 6 is removed from the surfaces of the sealing resin 5 and the bump 4, which operation is similar to that explained in the description of the first embodiment. The removal of the reinforcing plate 6 is performed as follows. That is, a structure in the state shown in FIG. 5A is immersed in a heated organic solution. When the structure is immersed in the organic solution, the chemical reaches the adhesive agent 7 through pores of the reinforcing plate 6 in order to dissolve the adhesive agent 7. The reinforcing plate 6 is removed by dissolving the adhesive agent 7.

Figure 5B:
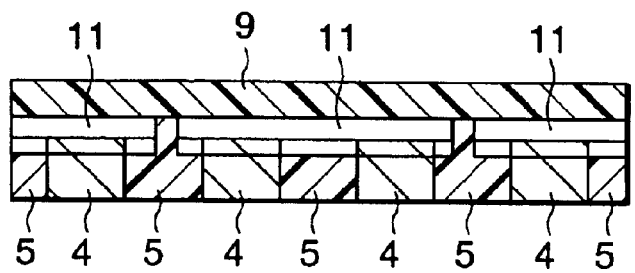

As a result, as shown in FIG. 5B, the structure is obtained in which: the bump 4 is formed on the surface of the semiconductor chip 11 that is thinned to approximately 10 $\mu$m; the space between the bumps 4 is sealed with the sealing resin 5 having a thickness of approximately 30 $\mu$m; and the rear surface of the semiconductor chips 11 is sealed with the sealing resin 9 having a thickness of approximately 30 $\mu$m.

In the embodiment, the semiconductor wafer is divided into semiconductor chips after grinding the wafer. This facilitates operation for fabricating a semiconductor device as is described later. Unlike the first embodiment, the second embodiment provides an advantageous method in which after the wafer is divided into the semiconductor chips, the entire structure containing side portions of the semiconductor chips are sealed with resin. Needless to say, the second embodiment produces beneficial effects as those observed in the first embodiment.

Although the first and second embodiments are constructed such that the sealing resin 5 is coated on the wafer to have the same height as that of the bump 4 in order to form the sealing resin 5 the embodiments may be constructed such that the sealing resin 5 is coated over the surface of the wafer including the bumps 4 and then the surface of the resin is ground to make the surfaces of the bumps 4 exposed.

A third embodiment of the present invention will be explained with reference to FIGS. 6A to 6D and FIGS. 7A, 7B. FIGS. 6A to 6D and FIGS. 7A, 7B are sectional views of a semiconductor wafer, illustrating steps of thinning the wafer in the order of the steps. Note that in the third embodiment, the same components as those of the first embodiment are denoted by the same reference numerals as those of the first embodiment.

Figure 6A:
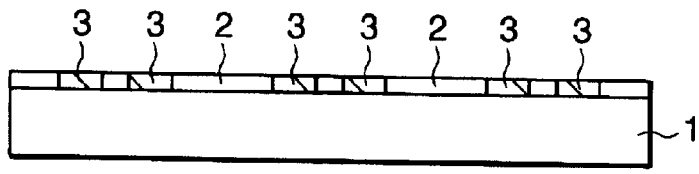
FIGS. 6A to 6D are sectional views of a semiconductor wafer, illustrating steps of thinning the wafer in the order of the steps.
Figure 6B:
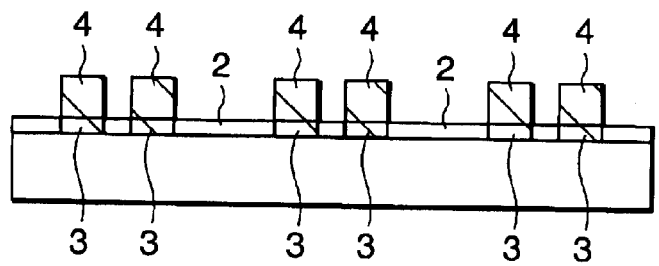

As shown in FIG. 6A, a passivation film 2 and an interconnect line 3 are formed on the surface of the semiconductor wafer 1 having, for example, a diameter of 8 inches and a thickness of approximately 800 $\mu$m. Then, as shown in FIG. 6B, a bump 4 is formed on the interconnect line 3. In this case, the height of the bump 4 is approximately 30 $\mu$m.

Figure 6C:
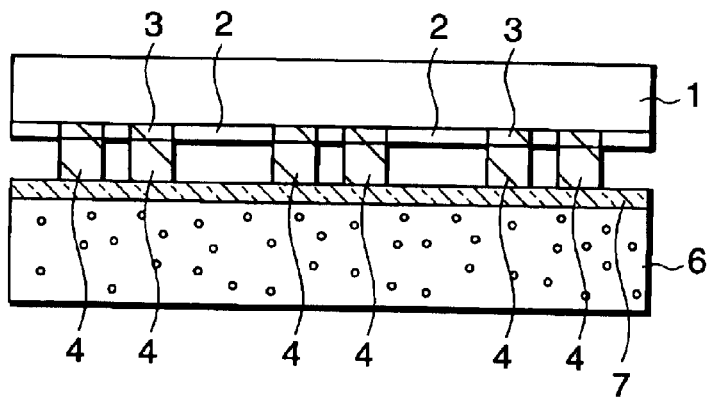

Then, as shown in FIG. 6C, surfaces of the bumps 4 on a front surface of the semiconductor wafer 1 are bonded to the surface of a reinforcing plate 6 via an adhesive agent 7 using a thermocompression bonding method. Note that the reinforcing plate 6 is a porous alumina plate having a thickness of 10 mm.

Figure 6D:
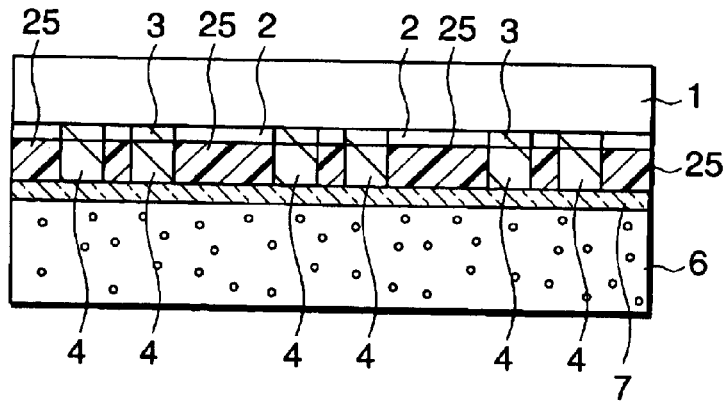

Then, as shown in FIG. 6D, a space between the bumps 4 of the semiconductor wafer 1 and the adhesive agent 7 on the reinforcing plate 6 is filled with a resin to form a sealing resin 25.

Figure 7A:
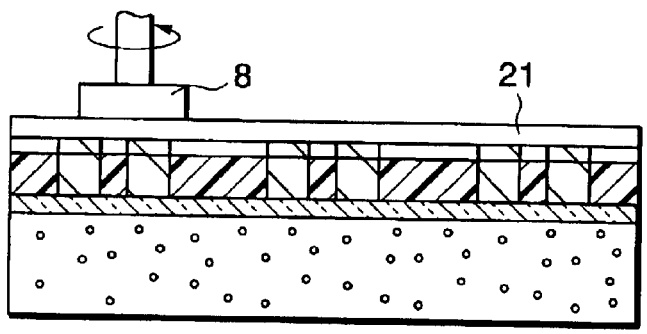
FIGS. 7A and 7B are sectional views of a semiconductor wafer, illustrating steps of thinning the wafer in the order of the steps.

Subsequently, as shown in FIG. 7A, a rear portion of the semiconductor wafer 1 is ground using a grind stone 8. Thereafter, wet etching is additionally performed using a mixed chemical containing nitric acid ($HNO_3$) and hydrofluoric acid (HF) to form an extremely thin semiconductor wafer 21 having a thickness of approximately 10 $\mu$m.

Figure 7B:
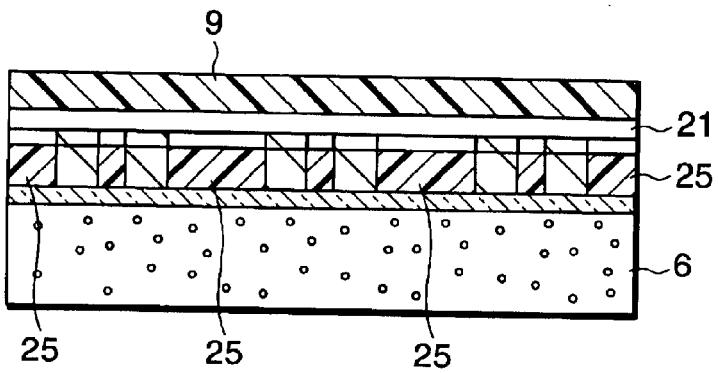

Then, as shown in FIG. 7B, a sealing resin 9 is formed over the rear surface of the semiconductor wafer 21 using the known method. In this case, the sealing resin 9 is formed of the same material as that of the sealing resin 5 and maybe formed to have the same thickness, i.e., 20 $\mu$m, as that of the sealing resin 5.

As a result, as shown in FIG. 7B, the structure is obtained in which the space between the surface of the semiconductor wafer 21 thinned to about 10 $\mu$m and the reinforcing plate 6 is filled with a resin is sealed with the sealing resin 25 having a thickness of approximately 30 $\mu$m, and the rear surface of the wafer is also sealed with the sealing resin 9 having a thickness of approximately 30 $\mu$m.

Figure 8A:
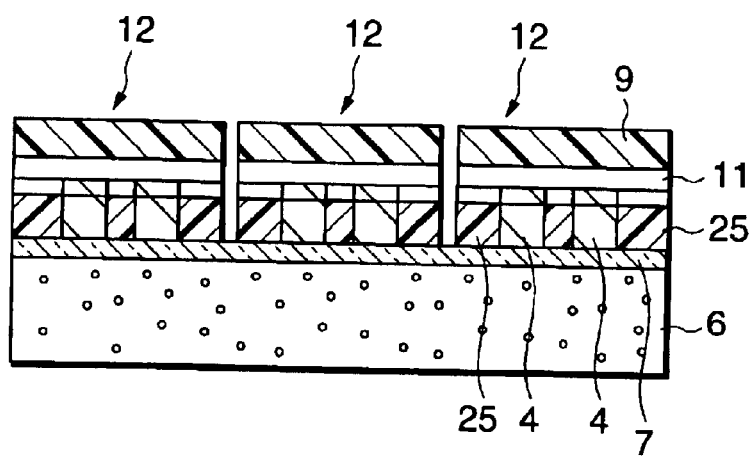
FIGS. 8A and 8B illustrate how the semiconductor wafer supported by the reinforcing plate 6 is divided together with the sealing resin into semiconductor chips using a dicing method.
Figure 8B:
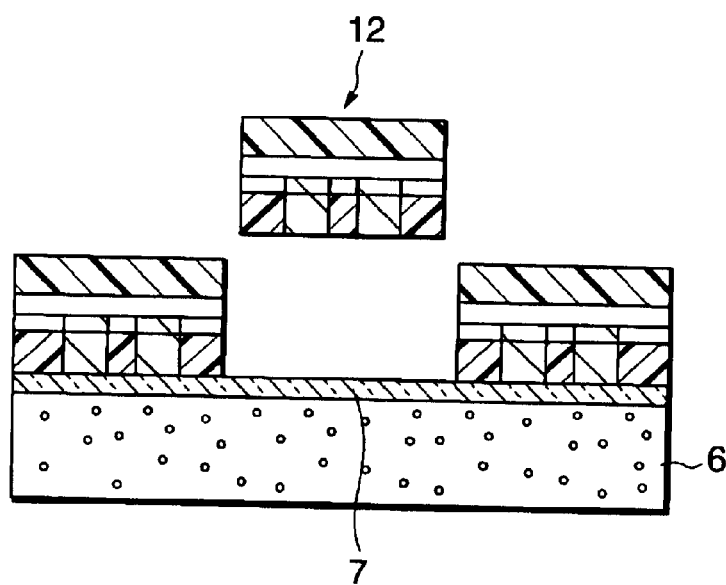
Figure 9A:
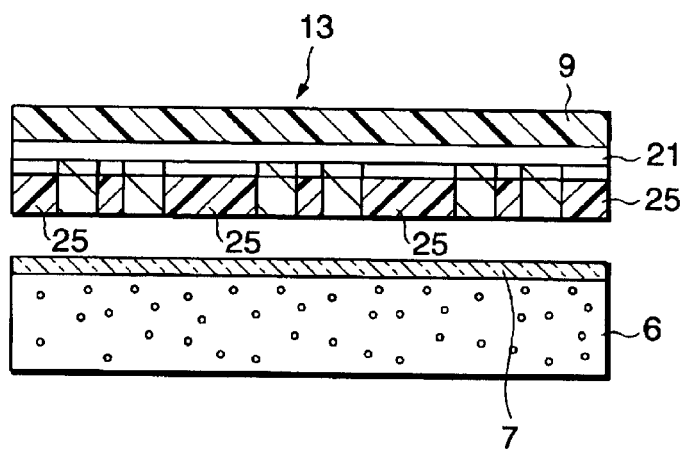
FIGS. 9A and 9B illustrate how the semiconductor wafer sealed with a resin and shown in FIGS. 3B, 7B is removed from the reinforcing plate and then is divided into semiconductor chips.
Figure 9B:
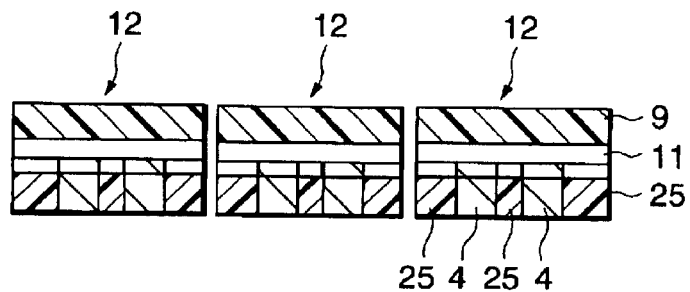

How the structure shown in FIG. 7B is divided into semiconductor chips will be described with reference to FIGS. 8A, 8B, 9A and 9B. FIGS. 8A and 8B illustrate how the semiconductor wafer supported by the reinforcing plate 6 is divided together with the sealing resin into semiconductor chips using a dicing method. FIGS. 9A and 9B illustrate how the semiconductor wafer sealed with a resin and shown in FIGS. 3B, 7B is removed from the reinforcing plate and then is divided into semiconductor chips.

As shown in FIG. 8A, the sealing resin 9, the semiconductor wafer 21 and the sealing resin 24, those components constituting the structure together with the reinforcing plate 6 and the adhesive agent 7, are divided using a dicing method into semiconductor chips to form a resin sealed chip 12. As shown in FIG. 8B, for example, ultraviolet rays are irradiated on the transparent reinforcing plate 6 and then the resin-sealed chip 12 is peeled off from the adhesive agent 7. Alternatively, the resin-sealed chip 12 may be peeled off from the structure such that the structure is immersed in the organic solution and then the chip is peeled off from the adhesive agent 7.

As shown in FIG. 9A, the resin-sealed chip 12 is removed from the reinforcing plate 6 by selectively dissolving the adhesive agent 7 in the heated organic solution, which operation is explained in the description of FIG. 3A. As a result, the semiconductor wafer 21 sealed with the sealing resin 25 and the sealing resin 9, namely, a resin-sealed wafer 13 is formed. Then, as shown in FIG. 9B, the resin-sealed wafer 13 is divided using a dicing method into the resin-sealed chips 12 by cutting predetermined portions of the wafer.

As shown in FIG. 9B, the structure is obtained in which: the bump 4 is formed on the surface of the semiconductor chip 11 that is thinned to approximately 10 μm; the space between the bumps 4 is sealed with the sealing resin 25 having a thickness of approximately 20 μm; and the rear surface of the resin-sealed chips 12 is sealed with the sealing resin 9 having a thickness of approximately 20 μm.

In the embodiment, the thickness of the sealing resin 25 can easily be adjusted. Furthermore, the bumps 4 and the sealing resin 25 can be made to have the completely same height. Therefore, when implementing a COC (chip on chip) technique or the like, a plurality of resin-sealed chips are easily bonded to one another through the bumps 4. Furthermore, the embodiment produces beneficial effects similar to those explained in the description of the first embodiment.

A fourth embodiment of the present invention will be explained with reference to FIGS. 10A to 10E. The embodiment employs a semiconductor wafer of an SOI structure. The SOI structure is not limited to a structure in which a silicon layer is formed on an insulating film and includes, for example, a structure in which a semiconductor layer such as a SiGe layer is formed on an insulating film. FIGS. 10A to 10E are sectional views of a semiconductor wafer, illustrating steps of thinning the wafer in the order of the steps. In this case, the embodiment may be configured not to contain above-described reinforcing plate 6. Note that in the fourth embodiment, the same components as those of the first embodiment are denoted by the same reference numerals as those of the first embodiment.

Figure 10A:
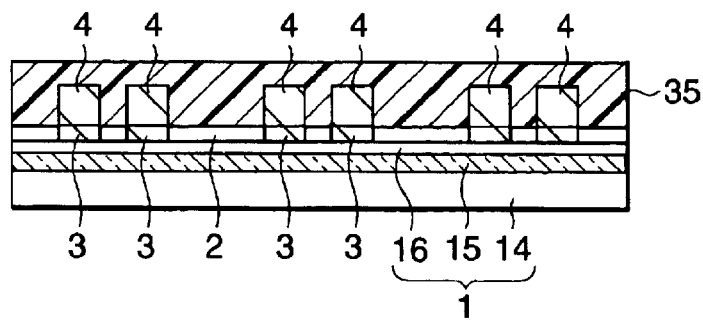
FIGS. 10A to 10E are sectional views of a semiconductor wafer, illustrating steps of thinning the wafer in the order of the steps.

As shown in FIG. 10A, an embedded insulating layer 15 and an SOI layer 16 are formed on a semiconductor substrate 14. The embedded insulating layer 15 is made from a silicon oxide film having a thickness of approximately 0.5 μm and the SOI layer 16 is made from a single crystalline silicon film having a thickness of approximately 0.1 μm, those components constituting a semiconductor wafer 1. Then, a passivation film 2 and an interconnect line 3 are formed on the surface of the semiconductor wafer 1, and a bump 4 is formed on the interconnect line 3. The height of the bump 4 is approximately 40 μm.

Subsequently, a sealing resin 35 is formed over the surface using the known method. Note that the sealing resin 35 is made to have a thickness of approximately 100 μm.

Figure 10B:
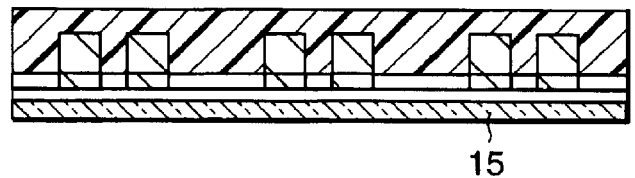

Then, as shown in FIG. 10B, the semiconductor substrate 14 is removed by wet etching. In this case, since the embedded insulating layer 15 serves as an etching stopper, variation in the amount of the semiconductor substrate 14 to be etched becomes negligible, which variation is not negligible when implementing the conventional technique.

Figure 10C:
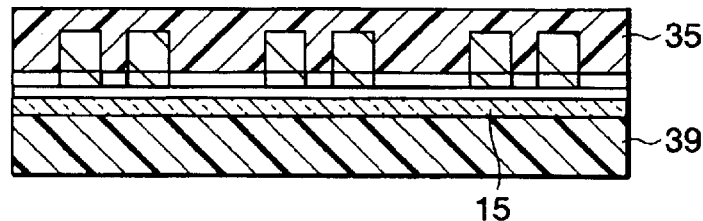

Then, as shown in FIG. 10C, a sealing resin 39 is formed on a rear surface of the embedded insulating layer 15 using the known method. In this case, the sealing resin 39 is formed of the same material as that of the above-described sealing resin 35 and may be formed to have the same thickness, i.e., 100 μm, as that of the sealing resin 35.

Figure 10D:
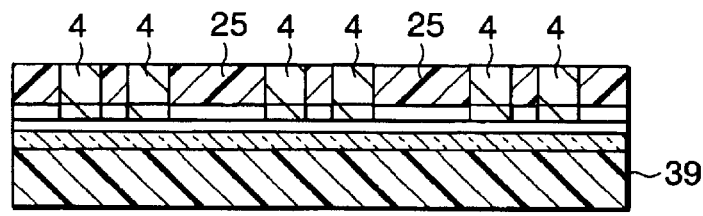

The sealing resin 35 is ground. Then, as shown in FIG. 10D, the sealing resin 35 is being ground until the surfaces of the bumps 4 are exposed to form a sealing resin 25 having a thickness of 40 μm. Likewise, the sealing resin 39 is ground to form a sealing resin 9 having a thickness of 40 μm. As a result, a structure is obtained in which the extremely thin SOI layer 16 having the bumps 4 formed thereon and the embedded insulating layer 15 is sealed with the sealing resin 25 and the sealing resin 9. How the structure shown in FIG. 10E is divided into semiconductor chips is the same as that explained in the description of FIGS. 9A and 9B.

Figure 10E:
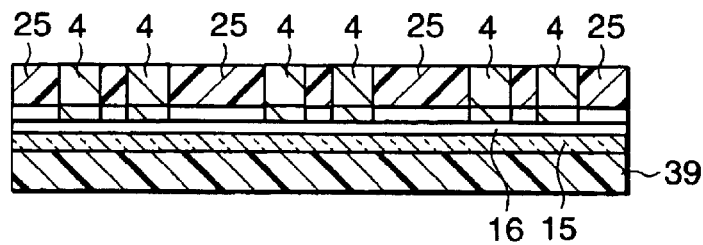

In the fourth embodiment, although the sealing resins 35 and 39 are ground, the embodiment may be configured not to grind first and second resin layers (corresponding to the sealing resins 35, 39) in order to form thinned resin layers shown in FIG. 10E.

When employing the embodiment, the steps of manufacturing a semiconductor device are simplified since the embodiment needs not the reinforcing plate employed in the first through third embodiments. As described above, in the case of the SOI structure, the embedded insulating layer 15 serves as an etching stopper for wet etching and therefore, even when the semiconductor wafer bends in the step of thinning the semiconductor wafer, variation in thickness of the semiconductor wafer after etching of the wafer rarely occurs.

However, when grinding the semiconductor substrate 14 in order to thin the substrate, a reinforcing plate needs to be employed, as is the case with the first through third embodiments. When employing the reinforcing plate in the embodiment as is the case with the first through third embodiments, the semiconductor wafer rarely bends, further improving stability of mass production.

In the above-described first through fourth embodiments, although the sealing resins 5, 25 that serve as the first resin layer are formed after the bump 4 as an electrode is formed, the present invention is not limited to such procedure, but may be configured to form an electrode after the first resin layer is formed. An electrode employed in such a case is not limited to the above-described bump electrode and may be other electrodes. That is, any electrode may be employed, provided that the electrode is a conductor connected to the substrate outside the corresponding semiconductor chip.

The present invention extremely facilitates dense integration of semiconductor chips. In particular, when implementing a CSP technique according to the present invention, a semiconductor chip can be thinned in a simplified manner and therefore, for example, cracks that are caused in a solder ball connection portion and due to a difference between thermal expansion coefficients of the connection portion and a motherboard to which the CSP is mounted can significantly be reduced, which cracks are developed when using the conventional technique, whereby reliability of packaging of semiconductor devices can largely be improved.

The present invention is not limited to the above-described embodiments, and the embodiments may be appropriately modified within the scope and spirit of the objects of the present invention.

As described above, according to the present invention, the electrodes are formed at the predetermined positions on a surface of the semiconductor wafer, on which surface semiconductor elements are formed, the first resin layer is formed so as to cover the surface and to make at least a portion of the surfaces of the electrodes exposed, the reinforcing plate is bonded to the first resin layer and the exposed surfaces of the electrodes using the adhesive agent, and the rear portion of the semiconductor wafer is removed by grinding or etching the rear portion to thin the wafer. Then, after the wafer is thinned, the rear surface of the semiconductor wafer is covered with the second resin layer.

Use of the present invention allows the semiconductor wafer to easily be thinned. Through the step of thinning the semiconductor wafer, the wafer rarely bends and indicates largely reduced variations in its thickness. Furthermore, a semiconductor device after being packaged exhibits improved reliability.

Furthermore, the semiconductor device can be manufactured through simplified steps and mass production of semiconductor devices using the invented packaging method becomes facilitated.

What is claimed is:

1. A method of manufacturing a semiconductor device, comprising the steps of:
    forming at least one electrode at a specific position on a semiconductor wafer, said specific position being located on a surface of said semiconductor wafer;
    bonding a reinforcing plate to a surface of said at least one electrode while interposing a first resin layer between said surface of said semiconductor wafer and said reinforcing plate via an adhesive;
    thinning said semiconductor wafer by removing a portion of said semiconductor wafer; and
    covering an exposed surface of said semiconductor wafer with a second resin layer, said exposed surface being produced by removing said portion of said semiconductor wafer.

2. The method according to claim 1, wherein said first resin layer is formed on said surface of said semiconductor wafer between said at least one electrode after the step of forming at least one electrode at a specific position on a semiconductor wafer and before the step of bonding a reinforcing plate to a surface of said at least one electrode.

3. The method according to claim 1, wherein said semiconductor wafer has at least one groove formed therein corresponding to at least one location of said surface of said semiconductor wafer and said first resin layer is formed on said surface of said semiconductor wafer between said at least one electrode after the step of forming at least one electrode at a specific position on a semiconductor wafer and before the step of bonding a reinforcing plate to a surface of said at least one electrode.

4. The method according to claim 1, wherein said first resin layer is formed between said surface of said semiconductor wafer and said reinforcing plate after the step of bonding a reinforcing plate to a surface of said at least one electrode and before the step of thinning said semiconductor wafer by removing a portion of said semiconductor wafer.

5. The method according to claim 1, wherein said reinforcing plate is comprised of porous ceramic.

6. The method according to claim 1, further comprising the step of immersing said reinforcing plate in an organic solution and dissolving said adhesive into said organic solution through said porous ceramic constituting said reinforcing plate to thereby remove said reinforcing plate from said surface of said at least one electrode after the step of covering an exposed surface of said semiconductor wafer with a second resin layer.

7. The method according to claim 6, further comprising the step of dividing said semiconductor wafer into a plurality of semiconductor chips after the step of immersing said reinforcing plate in an organic solution and dissolving said adhesive into said organic solution.

8. A method of manufacturing a semiconductor device, comprising the steps of:
    forming at least one electrode at a specific position on a semiconductor wafer having an SOI (Silicon On Insulator) structure, said specific position being located on a surface of said semiconductor wafer, said SOI structure being defined such that an insulation layer is formed over a silicon substrate and an active silicon layer is formed over said insulation layer;
    forming a first resin layer between said at least one electrode on said surface of said semiconductor wafer;
    thinning said semiconductor wafer by removing said silicon substrate of said semiconductor wafer to expose said insulation layer; and
    covering an exposed surface of said insulation layer with a second resin layer.

9. The method according to claim 8, further comprising the step of dividing said semiconductor wafer into a plurality of semiconductor chips after the step of covering an exposed surface of said insulation layer with a second resin layer.

10. A semiconductor device comprising:
    at least one electrode formed at a specific position on a semiconductor wafer, said specific position being located on a surface of said semiconductor wafer;
    a first resin layer interposed between said at least one electrode formed at a specific position on a semiconductor wafer and formed on said surface of said semiconductor wafer; and
    a second resin layer formed on an opposite surface of said semiconductor wafer, said opposite surface being produced by removing a portion of said semiconductor wafer, said portion being located opposite said surface of said semiconductor wafer.

11. The semiconductor device according claim 10, wherein said semiconductor wafer has an SOI (Silicon On Insulator) structure and said SOI structure is defined such that an insulation layer is formed over a silicon substrate and an active silicon layer is formed over said insulation layer, and wherein said at least one electrode is formed on said active silicon layer, and wherein said opposite surface of said semiconductor wafer is a surface of said insulation layer.

12. The semiconductor device according claim 10, wherein said semiconductor wafer contains at least one semiconductor chip and wherein said at least one semiconductor chip includes:
    said at least one electrode formed at a specific position on said at least one semiconductor chip, said specific position being located on a surface of said at least one semiconductor chip;

said first resin layer interposed between said at least one electrode formed at a specific position on said at least one semiconductor chip and formed on said surface of said at least one semiconductor chip; and said second resin layer formed on an opposite surface of said at least one semiconductor chip, said opposite surface being produced by removing a portion of said at least one semiconductor chip, said portion being located opposite said surface of said at least one semiconductor chip.

* * * * *